United States Patent Office 3,480,554

Patented Nov. 25, 1969

3,480,554
SINGLE PHASE LEAD TELLURIDE

Louis F. Kendall, Jr., Scotia, and James H. Bredt, Schenectady, N.Y., assignors to General Electric Company, a corporation of New York No Drawing. Continuation-in-part of application Ser. No. 547,425, May 4, 1966. This application Dec. 5, 1966, Ser. No. 598,937
Int. Cl. C01b *19/00;* H01v *1/18*
U.S. Cl. 252—62.3 9 Claims

ABSTRACT OF THE DISCLOSURE

The provision of high density polycrystalline single phase n-type and p-type lead telluride semiconductive thermoelectric generator elements is disclosed. In these materials, a single phase structure is achieved by the substantial elimination of the excess lead in the n-type and the excess tellurium in the p-type over stoichiometric PbTe, previously thought to be essential. The elimination of the lower melting point second phase improves certain thermoelectric, mechanical, and physical properties and provides materials having improved properties for use in the thermoelectric generation of power.

This invention relates to semiconductive materials and more particularly to improve n-type and p-type lead telluride semiconductive elements for use in the themoelectric generation of power, and is a continuation-in-part of application Ser. No. 547,425, filed on May 4, 1966, now abandoned, by the present applicants, entitled "N-Type Lead Telluride" and assigned to the assignee of the present application.

The direct conversion of heat to electricity by means of the Seebeck effect is well known and has been utilized in thermocouples constructed by joining two dissimilar metals or alloys for many years as a means of measuring temperature. These older conventional thermocouples were not suitable for use as electric power generators because of their relatively low efficiency, however, more recently discovered semiconductive materials when utilized in an analogous manner exhibit thermoelectric heat conversion efficiencies of up to ten times greater than those of the earlier metal thermocouples. For a more detailed discussion of such devices see "Direct Conversion of Heat to Electricity," edited by Kay and Welch, John Wiley and Sons, Inc. New York, 1960, chapter 16, p. 16–5.

One such semiconductive thermocouple having a high thermoelectric efficiency is the couple formed from n-type lead telluride and p-type lead telluride elements. These semiconductive elements are commercially available and as such are polycrystalline bodies formed by a powder metallurgy technique involving cold pressing followed by sintering. As is well known in the semiconductor art the semiconductive properties are produced in these materials by the addition thereto of "doping" agents which produce either the p-type or the n-type material. More specifically, the n-type material may be produced by doping with a small amount of iodine and excess lead, for example, and p-type material by doping with a small amount of sodium and excess tellurium, for example.

As pointed out in greater detail in U.S. Patent No. 3,268,330 issued on application Ser. No. 378,415, filed June 26, 1964 by the present inventors and assigned to the assignee of the present invention, entitled "Method for Producing Thermoelectric Elements," these previously known thermoelectric elements prepared by cold pressing and sintering exhibited certain undesirable properties, particularly a low density of about 85 percent of the theoretical density. In the invention of the aforesaid application, the inventors disclosed and claimed a process for producing such elements having significantly higher densities, i.e., at least 99.5 percent of the theoretical density, with an attendant improvement in the properties thereof.

The composition of these prior art semiconductive lead telluride elements contained lead in amounts considerably in excess, within the context of the semiconductor art, of the stoichiometric amount of lead in lead telluride. Such compositions contained from 61.95 percent by weight to about 63.0 percent by weight lead whereas stoichiometric lead telluride (PbTe) contains 61.887 percent by weight lead according to the 1961 system of International Atomic Weights. See, for example, U.S. Patent No. 2,811,440. As a consequence, these compositions when formed into thermocouple elements by cold pressing and sintering, are two-phase materials comprising a relatively porous primary phase of sintered lead telluride particles and excess free lead segregated on the grain boundaries of the porous lead telluride and forming the second phase. It should be noted that the solid solubility of elemental lead in the compound lead telluride is negligible, as is the solubility of the compound in elemental lead. The presence of this excess lead and hence the second phase was considered in the prior art to be desirable, if not absolutely necessary, for a variety of reasons. While the previously cited prior art patent discloses the manufacture of both p-type and n-type lead telluride two-phase bodies containing an excess of lead, it is also known that p-type bodies may be made by doping a lead-tellurium alloy containing an excess of tellurium with sodium. See U.S. Patent No. 2,811,441, for example. These bodies are also two phase in nature, a condition previously thought to be essential. Again, these bodies are composed primarily of grains of lead telluride as the major phase but in this case the minor or second phase is composed primarily of tellurium deposited at the grain boundaries. The presence of the minor phase is clearly deleterious because the phase must contain free tellurium and the tellurium-lead telluride eutectic melting temperature is about 405° C. At a thermoelectric generator operating temperature of between 550° and 600° C., this phase not only melts but also dissolves some of the lead telluride major phase. Such melting of some of the thermoelectric material obviously degrades the mechanical properties of the thermoelectric element and also facilitates transport of the material or its constituents and is probably at least partly responsible for the observed apparent de-doping of p-type thermoelements which seems to be responsible for the degradation of their power producing capacity in long service at high temperatures. Surprisingly, it has been discovered by the present inventors that when lead telluride thermocouple elements are made in accordance with the disclosure of their patent, previously cited, that the relatively large amounts of excess lead and tellurium employed by these prior art compositions and the resultant second phases are undesirable in these high (99.5+ percent theoretical) density materials.

It is therefore a principal object of this invention to provide high density, single phase lead telluride bodies.

It is a further object of this invention to provide high density polycrystalline single phase lead telluride bodies.

It is a yet further object of this invention to provide high density polycrystalline single phase bodies of n-type lead telluride.

It is still a further object of this invention to provide high density polycrystalline single phase bodies of p-type lead telluride.

Other objects of this invention will become apparent to those skilled in the art from the detailed description which follows.

Briefly stated and in accordance with one aspect of the invention, it has been found that by the elimination of excess elemental lead in the forming of high density n-type lead telluride thermoelectric generator elements, the problem of "shorting out" caused by the migration of lead is avoided, higher Seebeck coefficients and good mechanical properties at elevated temperatures are achieved, and the resulting composition has up to a 20 percent improvement in thermal conductivity. With respect to the p-type lead telluride, the principal advantages achieved by the elimination of the second phase lie in improved mechanical properties and improved elevated temperature stability.

More particularly, when high density n-type lead telluride elements were prepared having the same composition as commercially available low density elements, it was found that during use as a thermocouple element in the thermoelectric generation of power, the second phase lead tended to migrate to form a zone of high lead concentration and cause shorting out in that zone. These elements were formed by hot pressing a composition corresponding to the commercially available material, namely $$Pb_{1.007}I_{0.0006}Te$$

or about 62.037 percent lead, 0.023 percent iodine, and 37.940 percent tellurium, all by weight. Appropriate amounts of high purity lead, tellurium, and lead iodide were utilized and elements in the form of right circular cylinders were produced in accordance with the process described in detail in the aforementioned copending patent application. These elements were then assembled each as one of a pair of elements with p-type lead telluride elements to form a thermoelectric generator. In operation, a temperature gradient is maintained along the length of these cylindrical elements, as is well known, such that one end of the element is maintained at about 500° C. and the other end at about 100° C. After a period of time under these conditions, a decline in power output was noted. Upon investigation, it was found that the excess lead comprising the second phase had apparently melted adjacent the high temperature end of the elements and migrated along the length of the elements toward the low temperature end until it reached the temperature zone corresponding to the melting point of lead, 327° C., whereupon it accumulated to produce a zone of high lead concentration to the extent that those zones of the elements were effectively shorted out.

A number of elements were similarly manufactured and tested in which the excess lead was eliminated, thereby providing a material which was essentially a single phase. These compositions and the measured Seebeck coefficients expressed as an average between about 260° C. and 600° C. in microvolts per degree Celsius are shown in the following table.

TABLE I

| $Pb_{1+x}I_xTe$ | Percent by Weight | | | Seebeck coefficient |
|---|---|---|---|---|
| X | Pb | I | Te | |
| 0.00040 | 61.887 | 0.015 | 38.098 | −312 |
| 0.00050 | 61.887 | 0.019 | 38.094 | −239 |
| 0.00060 | 61.887 | 0.023 | 38.090 | −233 |
| 0.00100 | 61.887 | 0.038 | 38.075 | −206 |
| $Pb_{1.001}I_{0.005}Te$ | 61.899 | 0.019 | 38.082 | −237 |

By way of comparison, the commercially available material has a Seebeck coefficient of about −194. Furthermore, these improved materials have a thermal conductivity of between 0.012 and 0.013 watt per centimeter per degree Celsius expressed as an average between 300 to 600° C., whereas the commercial material has an average thermal conductivity of about 0.015 watt per centimeter per degree Celsius in the same temperature range.

The mechanical strengths of these materials shown as an average of three tests at each indicated temperature are shown in the following table.

TABLE II

| | Yield Stress (p.s.i.) | |
|---|---|---|
| | Compression | Shear |
| Temperature, ° C.: | | |
| Room | 14,600 | 2,792 |
| 200 | 5,230 | 1,806 |
| 400 | 2,036 | 1,223 |
| 500 | 1,653 | 1,003 |
| 600 | 1,450 | 604 |

With respect to p-type lead telluride, the conventional method of preparing sodium doped semiconductive material has been to melt high purity (99.999 percent pure) lead, tellurium, and sodium together in proportions which, for convenience, may be expressed by the formula $$PbNa_xTe_{1+y}$$

where $x$ and $y$ are numbers much smaller than unity but not necessarily equal. It has previously been thought that the addition of sodium to a composition having the formula $PbTe_{1+y}$ increases the free hole concentration as long as the sodium concentration is less than or equal to the excess tellurium $y$ but that little or no further increase was obtainable for values of $x$ larger than $y$. Additionally, these previous materials were thought to require such relatively high levels of dopant $x$ that a major fraction of the excess tellurium and sodium is segregated in the grain boundaries of the lead telluride as a second eutectic phase. When an effort was made to reduce the amount of the second phase to produce an essentially single phase material having the composition $PbNa_{0.001}Te_{1.001}$ the resulting lead telluride was found to be grossly underdoped.

It was then conceived that if a single crystal ingot of p-type lead telluride could be produced and subsequently crushed and hot pressed as set forth in the previously cited patent, the resulting polycrystalline high density p-type lead telluride body should be all one phase. Accordingly, an ingot having the formula $PbNa_{0.00500}Te_{1.00501}$ corresponding to a composition of 61.748 percent lead, 0.034 percent sodium, and 38.218 percent tellurium was prepared by melting appropriate amounts of the high purity elements in an evacuated, sealed quartz tube, the interior surface of which had been coated with pyrolytic graphite. After the material had become molten it was quenched and the ingot removed from the tube and cleaned. This composition is a conventional two-phase material. The ingot was then broken up and the pieces inserted in a quartz tube about 0.5 cm. in diameter, the interior of which was coated with pyrolytic graphite and the tube was raised to about 150° C. as the interior was pumped down to remove water vapor and adsorbed gases. When a stable vacuum of about $10_{-}^{6}$ torr. was reached, the tube was sealed off. The tube was then heated to the melting point of the contained material in a horizontal position and cooled to form an ingot about ten inches long having a semicircular cross-section which was slightly smaller than one-half the diameter of the tube. The tube with the ingot in it was placed in a conventional zone refining apparatus in a horizontal attitude, which apparatus maintained the entire tube and its contents at a temperature of 500° C. while a narrow molten zone produced by a resistance heater was passed from one end of the ingot to the other once over a period of forty-eight hours.

The ingot was removed from the tube and was composed of a single crystal. The electrical resistivity values measured along the length of the ingot varied between 300 and 400 microohm centimeter and the Seebeck coefficients were between 50 and 70 microvolts per degree Celsius, which values are characteristic of very highly doped material.

The single crystal ingot was crushed and a portion of the material in the −60 to +200 mesh size range was hot pressed into eighteen thermoelements according to the procedure disclosed in the aforementioned patent. Upon microscopic examination, these polycrystalline bodies were found to be composed entirely of single phase material with no visible second phase present. As further confirmation of this, two of the eighteen samples were hot pressed at 860° and 870° C. instead of the 740° to 790° C. temperature range necessary for the formation of coherent two phase p-type bodies. These specimens were coherent bodies as ejected from the forming die whereas the two-phase material pressed at these higher temperatures emerge from the die as a powder of polyhedral grains. When these higher temperature formed bodies were fractured, the fracture was formed by cleavage planes through the individual grains and not along the grain boundaries as occurs in the two-phase material, further evidence of the lack of the second phase. This fracture habit was also observed in the remainder of the eighteen specimens which were hot pressed in the lower temperature range. The electrical properties of these specimens were measured before fracture and the room temperature resistivities ranged between 310 to 430 microohm centimeter and See-back coefficients from +54 to +63 microvolts/° C.

When the material from the zone refined ingot was analyzed, it was apparent that virtually no sodium had been removed by the zone refining but that the second phase which was removed was primarily tellurium. The average ratio of the number of sodium atoms to the number of excess tellurium atoms remaining in the material was 2.07:1, which strongly suggests that the sodium is present predominantly as $Na_2Te$ in solid solution in the PbTe. The average analysis of this material was about 61.80 percent lead, 0.047 percent sodium and 38.20 percent tellurium, all by weight, and had an average formula of about $PbNa_{0.0068}Te_{1.0034}$, or more conveniently, $PbTe+0.0034(Na_{2.00}Te)$ within the accuracy of the anaylsis.

It was conceived that such single phase p-type polycrystalline lead telluride bodies could be prepared directly without the necessity of the zone refining step. Accordingly, a composition containing 61.794 weight percent lead, 0.040 weight percent sodium, and 38.166 weight percent tellurium, a composition conveniently represented by the formula $PbNa_{0.00580}Te_{1.00290}$ or $PbTe+0.0029(Na_{2.0000}Te)$ was cast into an ingot. Electrical measurements made on this ingot revealed resistivity values from 280 to 350 microohms centimeter and Seeback coefficients from +57 to +61 microvolts/° C. The ingot was crushed and twenty-seven samples were hot pressed from the powdered material having particle sizes between −60 and +20 mesh size. About half of these were pressed at temperatures around 880° C. and the balance in the 740° C. to 790° C. temperature range. The samples pressed at the lower temperatures revealed electrical resistivities of from 670 to 790 microohm centimeter and Seeback coefficients from +64 to +76 microvolts/° C. Those pressed at the higher temperatures had resistivities of from 510 to 590 microohm centimeter and Seeback coefficients of from +60 to +69 microvolts/° C.

From the foregoing, it will be appreciated by those skilled in the art that these high density single phase materials have mechanical properties which are comparable to the commercially available two phase materials. However, at elevated temperatures, the two phase material fails by brittle fracture when it is subjected to excessive loading, whereas under the same conditions the single phase material plastically deforms without losing its physical integrity. This property enables the single phase material to sustain loads exceeding the yield stress without failing mechanically. Furthermore, the single phase nature of the material enables it to be hot pressed at any temperature up to the melting point without developing an extensive liquid phase. The presence of this liquid phase at high temperatures in two phase material leads to the formation of intergranular eutectic deposits which cause the resulting compacts to crumble easily into a powder consisting of the component grains. These desirable properties of the single phase materials are achieved by the elimination of the second phase in the n-type material composed of excess lead formerly thought to be desirable in these compositions by keeping the lead content of these compositions to below about 61.9 percent by weight and preferably between that value and about 61.887 percent by weight. With respect to the single phase p-type lead telluride doped with sodium, it is preferred that the excess tellurium present over the stoichiometric amount be limited to approximately one-half the amount of sodium expressed on an atomic percent basis, for example by the formula $PbTe+x(Na_yTe)$, where $x$ is equal to about 0.001 to 0.01 and $y$ is equal to about 1.5 to 2.5, which represents materials containing from about 61.546 to about 61.857 weight percent lead, from about 0.010 to about 0.171 weight percent sodium and from about 38.133 to about 38.283 weight percent tellurium.

While in the foregoing description of the invention, certain specific compositions have been disclosed as examples in order to provide a more complete disclosure, it is not intended that the invention be limited to those specific examples but only by the claims which follow.

What we claim as new and desire to secure by Letters Patent of the United States is:

1. A polycrystalline thermoelecrtic generator element consisting essentially of hot pressed lead telluride having at least 99.5% of theoretical density as a single phase.

2. The thermoelectric generator element set forth in claim 1 wherein said lead telluride is a semiconductive material of the n-type.

3. The thermoelectric generator element set forth in claim 2 wherein the lead content of said element is less than about 61.9 percent by weight.

4. The thermoelectric generator element set forth in claim 2 wherein the lead content of said element is between about 61.9 and about 61.887 percent by weight.

5. The thermoelectric generator element set forth in claim 2 wherein said single phase lead telluride has a composition represented by the formula $$Pb_{(1+x)}I_yTe$$

wherein $x$ and $y$ are finite numbers lying within the range of about 0.00030 to about 0.00100, and in which composition the lead content does not exceed about 61.9 percent by weight.

6. The thermoelectric generator element set forth in claim 1 wherein said lead telluride is a semiconductive material of the p-type.

7. The thermoelectric generator element set forth in claim 6 wherein the tellurium content of said element is less than about 38.29 percent by weight.

8. The thermoelectric generator element set forth in claim 6 wherein the tellurium content of said element is between about 38.13 and 38.29 percent by weight.

9. The thermoelectric generator element set forth in claim 6 wherein said single phase lead telluride has a composition represented by the formula $$PbTe+x(Na_yTe)$$

wherein $x$ and $y$ are finite numbers having values of from about 0.001 to 0.01 for $x$ and from about 1.5 to 2.5 for $y$.

References Cited

UNITED STATES PATENTS

| | | | |
|---|---|---|---|
| 3,268,330 | 8/1966 | Kendall et al. | 75—226 |
| 3,321,336 | 5/1967 | Turner et al. | |

OTHER REFERENCES

Hansen et al.: "Constitution of Binary Alloys" (2nd ed.), McGraw-Hill (1958), pp. 1110–2.

TOBIAS E. LEVOW, Primary Examiner

J. COOPER, Assistant Examiner

U.S. Cl. X.R.

75—166; 136—238, 239